United States Patent [19]

Yazawa

[11] Patent Number: 5,657,466
[45] Date of Patent: Aug. 12, 1997

[54] CIRCUIT FOR DESIGNATING WRITE AND READ ADDRESS TO PROVIDE A DELAY TIME IN A SOUND SYSTEM

[75] Inventor: Akira Yazawa, Tokyo, Japan

[73] Assignee: NEC Corporation, Japan

[21] Appl. No.: 703,929

[22] Filed: Aug. 28, 1996

Related U.S. Application Data

[63] Continuation of Ser. No. 187,802, Jan. 26, 1994, abandoned, which is a continuation of Ser. No. 670,041, Mar. 15, 1991, abandoned.

[30] Foreign Application Priority Data

Mar. 16, 1990 [JP] Japan .................................. 2-66564

[51] Int. Cl.[6] .................................................. G06F 12/06
[52] U.S. Cl. .................................. 395/421.1; 395/486
[58] Field of Search .................................. 395/481, 486, 395/421.03, 421.07, 421.08, 421.09, 421.1, 421.11; 364/194

[56] References Cited

U.S. PATENT DOCUMENTS

| | | | |
|---|---|---|---|
| 4,213,191 | 7/1980 | Gemp | 365/73 |
| 4,484,477 | 11/1984 | Buxton | 395/400 |
| 4,616,313 | 10/1986 | Aoyagi | 395/400 |
| 5,058,076 | 10/1991 | Kiuichi | 365/230.01 |

*Primary Examiner*—Eddie P. Chan
*Assistant Examiner*—Kevin L. Ellis
*Attorney, Agent, or Firm*—Laff, Whitesel, Conte & Saret, Ltd.

[57] ABSTRACT

A write address and a read address are generated by use of a pointer register and a single register set common to the write and read addresses. The read register is obtained by an addition or subtraction of a pointer value and a value selected from offset values of the register set, and the write register is obtained by adding one to the read address or subtracting one therefrom.

5 Claims, 6 Drawing Sheets

CIRCUIT FOR DESIGNATING WRITE AND READ ADDRESS TO PROVIDE A DELAY TIME IN A SOUND SYSTEM

This application is a continuation of application Ser. No. 08/187,802, filed Jan. 26, 1994, which was a continuation of Ser. No. 07/670,041, filed Mar. 15, 1991, both now abandoned.

BACKGROUND OF THE INVENTION

The present invention relates to a circuit for generating an address of a random access memory (abbreviated RAM hereinafter), and more particularly to, a circuit for designating write and read addresses of a RAM which functions as a delay circuit in an audio surrounding system.

The recent audio surrounding system which delays digital audio data often uses a RAM as a delay circuit, in which the audio data is written at a write address into the RAM, and it is read at a read address therefrom by a predetermined delay time. The write and read addresses are designated by an address generation circuit.

One type of a conventional address generation circuit comprises a pointer register, a write offset register set, and a read offset register set. The pointer register indicates a pointer value of each write and read addresses. The write and read offset register sets respectively include a plurality of offset registers each having a different offset value. The offset value indicates an offset from the pointer. Therefore, the write and read addresses are designated to provide a predetermined delay time, for instance, by the addition of the pointer value and the offset values.

Another type of a conventional address generation circuit modifies the former one, so that the write and read offset values are obtained from one common offset register set. For this common-use purpose, this address generation circuit further comprises a pointer register controller which changes a pointer value of the pointer register dependent on a state of a write and read control signal.

Still another type of a Conventional address generation circuit includes a RAM which is divided into a plurality of storage regions each having a different delay amount. Each data is stored in a corresponding storage region based on the required delayed amount.

However, the above conventional address generation circuits have the following disadvantages:
1. In the first conventional one, the construction thereof becomes complicated, since this address generation circuit includes two offset register sets each having a plurality of offset registers for different offset values;
2. In the second conventional one, the construction thereof and a control system thereof become complicated due to the inclusion of the pointer register controller;
3. In the third conventional one, it is difficult to effectively utilize all the storage regions, when a required delay time is small as compared to a delay time determined by an address length of a divided storage region.

SUMMARY OF THE INVENTION

Accordingly, it is an object of the present invention to provide a novel and useful circuit for generating an address of a RAM in which the above disadvantages are eliminated.

Another object of the present invention is to provide a circuit for generating an address of a RAM having a simple construction, requiring a simple control system, and providing an effective use of a RAM.

According to the present invention, a circuit for generating an address of a RAM, comprises:

a pointer register for storing a predetermined pointer value;

a set of registers for storing offset values, one of the registers being sequentially selected to provide one of the offset values in a predetermined pointer order; and means for calculating write and read addresses by receiving the pointer value and one offset value selected from the offset values;

wherein the calculating means provides a read address in an adding calculation of the pointer value and the selected one offset value, and a write address in an adding calculation of the pointer value, the selected one offset value and one.

According to another feature of the present invention, a circuit for generating an address of a RAM, comprises:

a pointer register for storing a predetermined pointer value;

a set of registers for storing offset values, one of the registers being sequentially selected to provide one of the offset values in a predetermined order; and means for calculating write and read addresses by receiving the pointer value and one selected value from the offset values;

wherein the calculating means provides a read address in a subtracting calculation of one selected value from the pointer value, and a write address in a subtracting calculation of one selected value and one from the pointer value.

BRIEF DESCRIPTION OF THE DRAWINGS

Other objects and further features of the present invention will become apparent from the following description when read in conjunction with the accompanying drawings, wherein.

DESCRIPTION OF THE PREFERRED EMBODIMENTS

Before explaining the preferred embodiments of the present invention, a detail description will now be given of the conventional address generation circuits with reference to FIGS. 1 to 4.

Figure 1A:
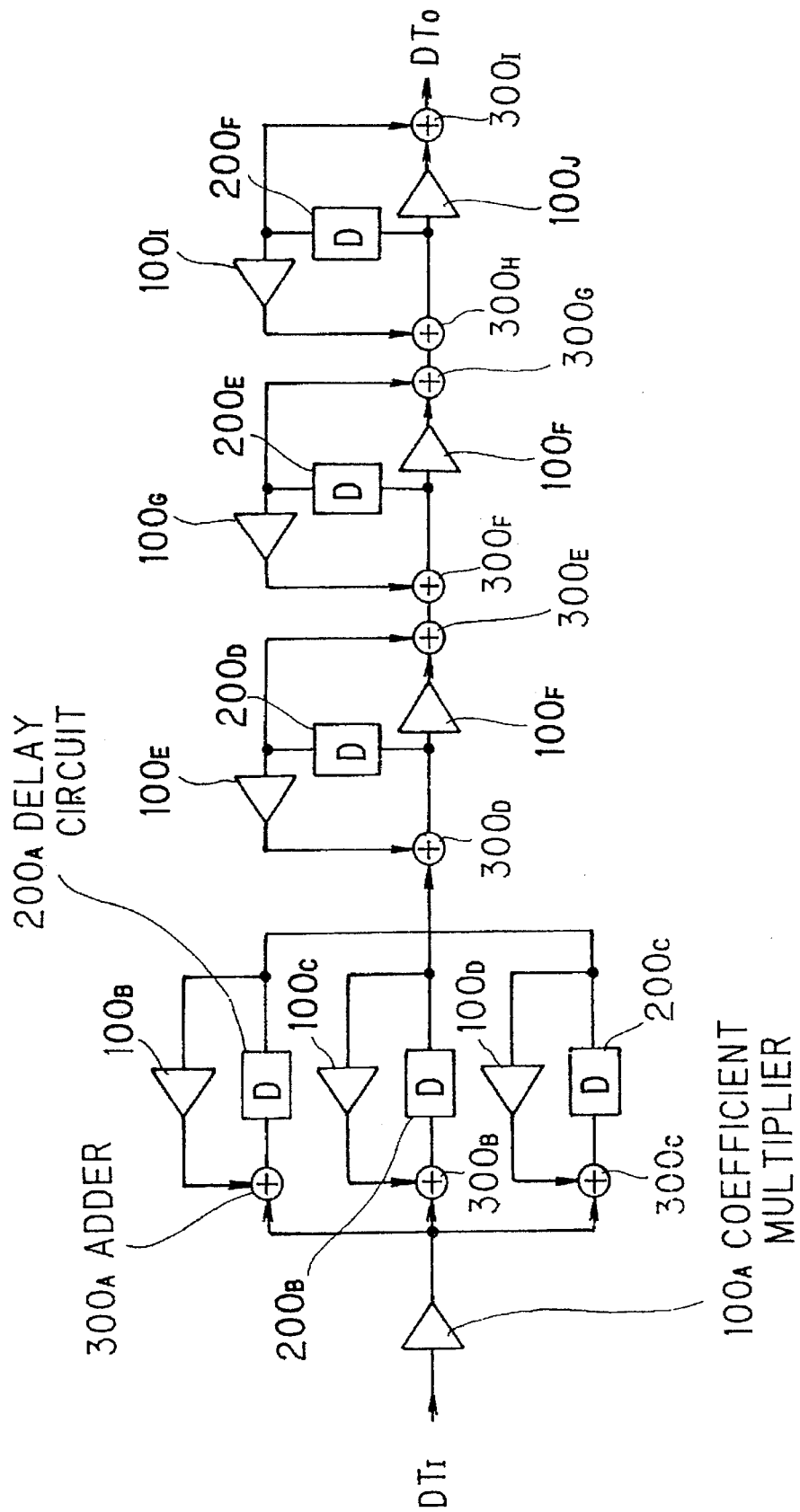
FIGS. 1A and 1B are block diagrams showing surrounding circuits, to which a circuit for generating an address of a RAM functioning as a delay circuit is applied.
Figure 1B:
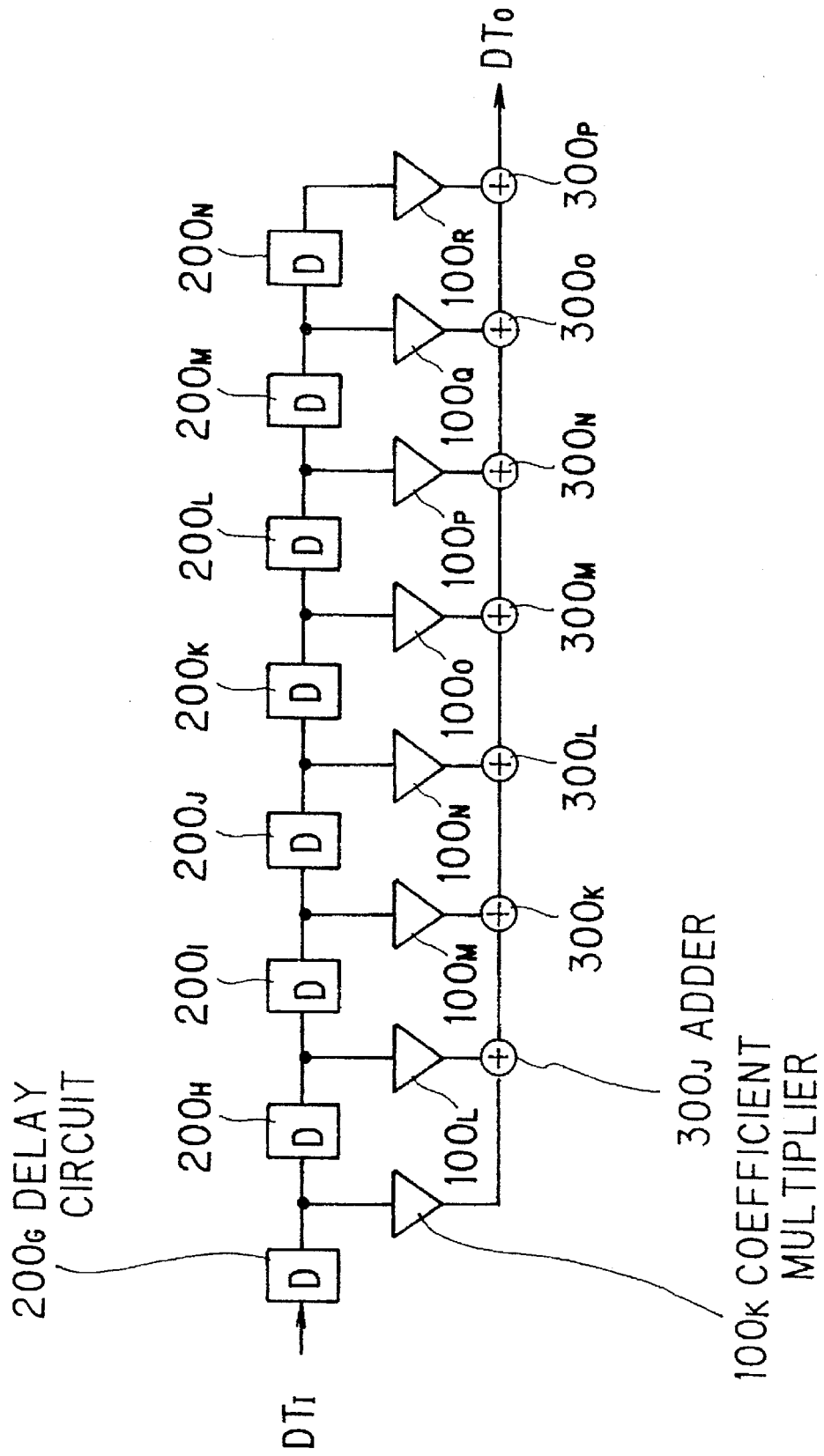

FIGS. 1A and 1B respectively show surrounding circuits which achieve the surrounding function. Numerals $100_A$ to $100_R$ denote coefficient multipliers, numerals $200_A$ to $200_N$ denote delay circuits, numerals $300_A$ to $300_P$ denote adders, and letters $DT_1$ and $DT_O$ denote input and output audio data, respectively. The surrounding circuits achieve the audio surrounding systems which surround a predetermined point by audio sound. For this purpose, the surrounding circuits utilize the reflection and the delay of audio sound. The surrounding circuit shown in FIG. 1A includes a plurality of feedback circuits, so that the audio sound can be reflected more than twice before it reaches the predetermined point. As a result, the reverberation characteristic is obtained in this circuit. On the other hand, the surrounding circuit shown in FIG. 1B includes no feedback circuits, so that the audio sound is reflected only once before it reaches the predetermined point. Both surrounding circuits include a plurality of delay circuits which delay the audio data which are processed to provide the audio sound. Each delay amount of a corresponding delay circuit is determined by taking the timing of the reflecting of the audio sound into consideration. The delay circuit often comprises a RAM, as mentioned above.

Figure 2:
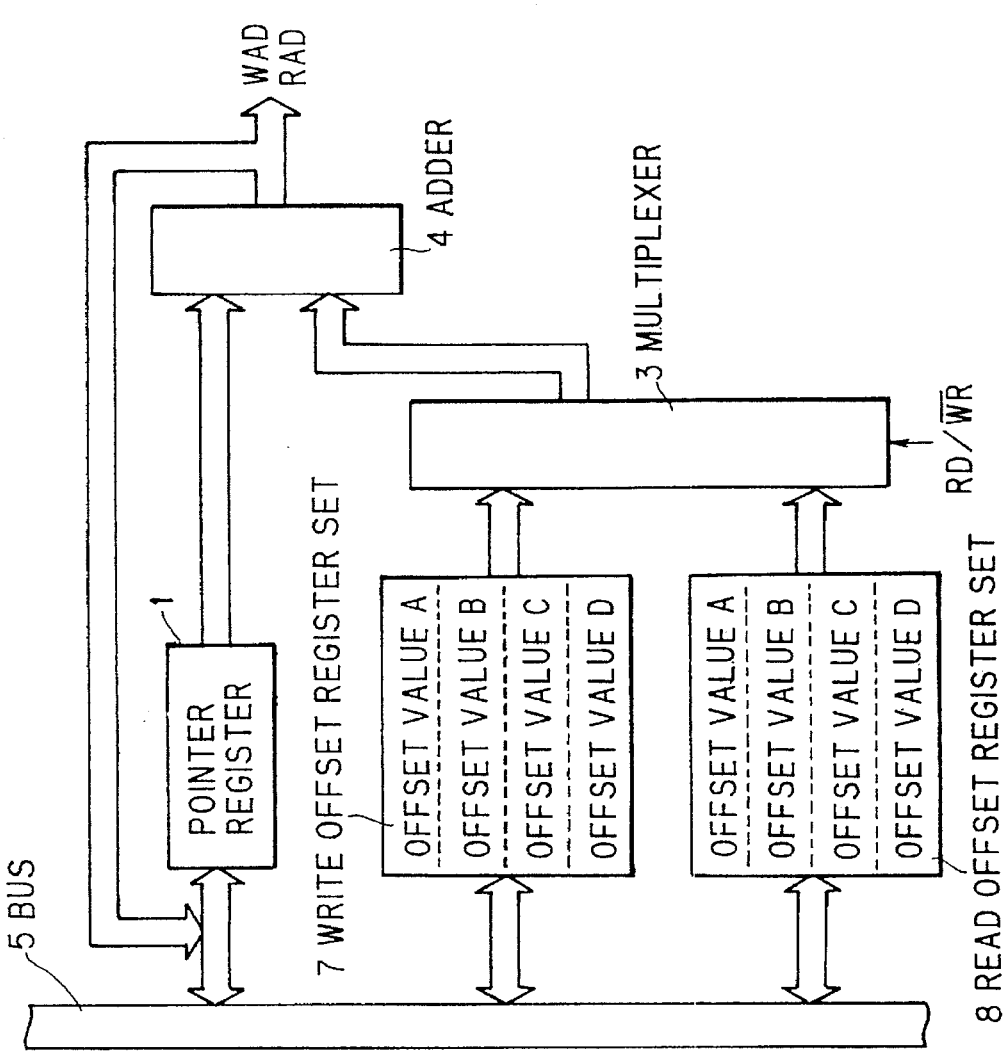
FIG. 2 is a block diagram showing one type of a conventional circuit for generating an address of a RAM.

FIG. 2 shows a block diagram of the aforementioned first conventional address generation circuit. This address generation circuit comprises a pointer register 1, a write offset register set 7, a read offset register set 8, a multiplexer 3, and an adder 4. The pointer register 1, and the write and read offset register sets 7 and 8 are coupled to a bus 5. The pointer register 1 stores a pointer value which is transferred through the bus 5 from a control unit (not shown) and may be renewed by write and read addresses to be outputted from the adder 4A. The write and read offset register sets 7 and 8 respectively have a plurality of offset registers having different offset values corresponding to the required delay amount. The multiplexer 3 selects a register of the write and read offset register sets 7 and 8, respectively, based on a read/write (abbreviated RD/$\overline{WR}$ hereinafter) control signal. The adder 4, coupled to the pointer register 1 and the multiplexer 3, adds the output of the pointer register 1 to that of the multiplexer 3 to generate a write or read address.

In operation, it is assumed that the pointer value and the offset value have already been set by the control unit. When the $\overline{WR}$ control signal (RD/$\overline{WR}$=0) is supplied to the multiplexer 3, the address generation circuit generates the write address. That is, one of the offset registers in the write offset register set 7 is selected to provide one of offset values A, B, C and D stored therein through the multiplexer 3 to the adder 4. The adder 4 adds the selected offset value to the pointer value from the pointer register 1 so as to generate the write address WAD.

On the other hand, when the RD control signal (RD/$\overline{WR}$=1) is supplied to the multiplexer 3, the address generation circuit generates the read address. That is, one of the offset registers in the read offset register set 8 is selected to provide one of offset values A, B, C and D stored therein. The adder 4 adds the selected offset value to the pointer value so as to generate the read address RAD. The output of the adder 4 may be fed back to the pointer register 1, so that the pointer value of the pointer register 1 is renewed after the write and/or read addresses are generated.

Figure 3:
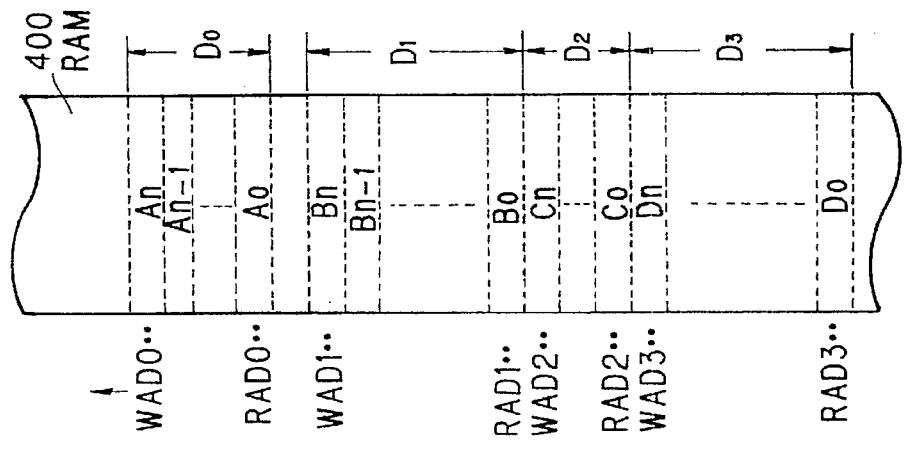
FIG. 3 is an explanatory diagram showing an address map of the RAM in FIG. 2.

Consequently, an address map representing the write and read addresses WADn and RADn (n=0,1,2, . . . ) is formed as shown in FIG. 3, wherein Dn (n=0,1,2, . . . ) respectively denotes the delay amounts. As shown in FIG. 3, audio data An, Bn, Cn and Dn (n=0,1,2, . . . ) are stored in a RAM 400. For instance, the audio data $A_0$ which was written into the RAM 400 at an (n+1) preceding time is read therefrom at the designated read address RAD0 by the delay time $D_0$ equal to the (n+1) write and read clock pulse duration which corresponds to the difference of the write and read addresses WAD0 and RAD0.

Figure 4:
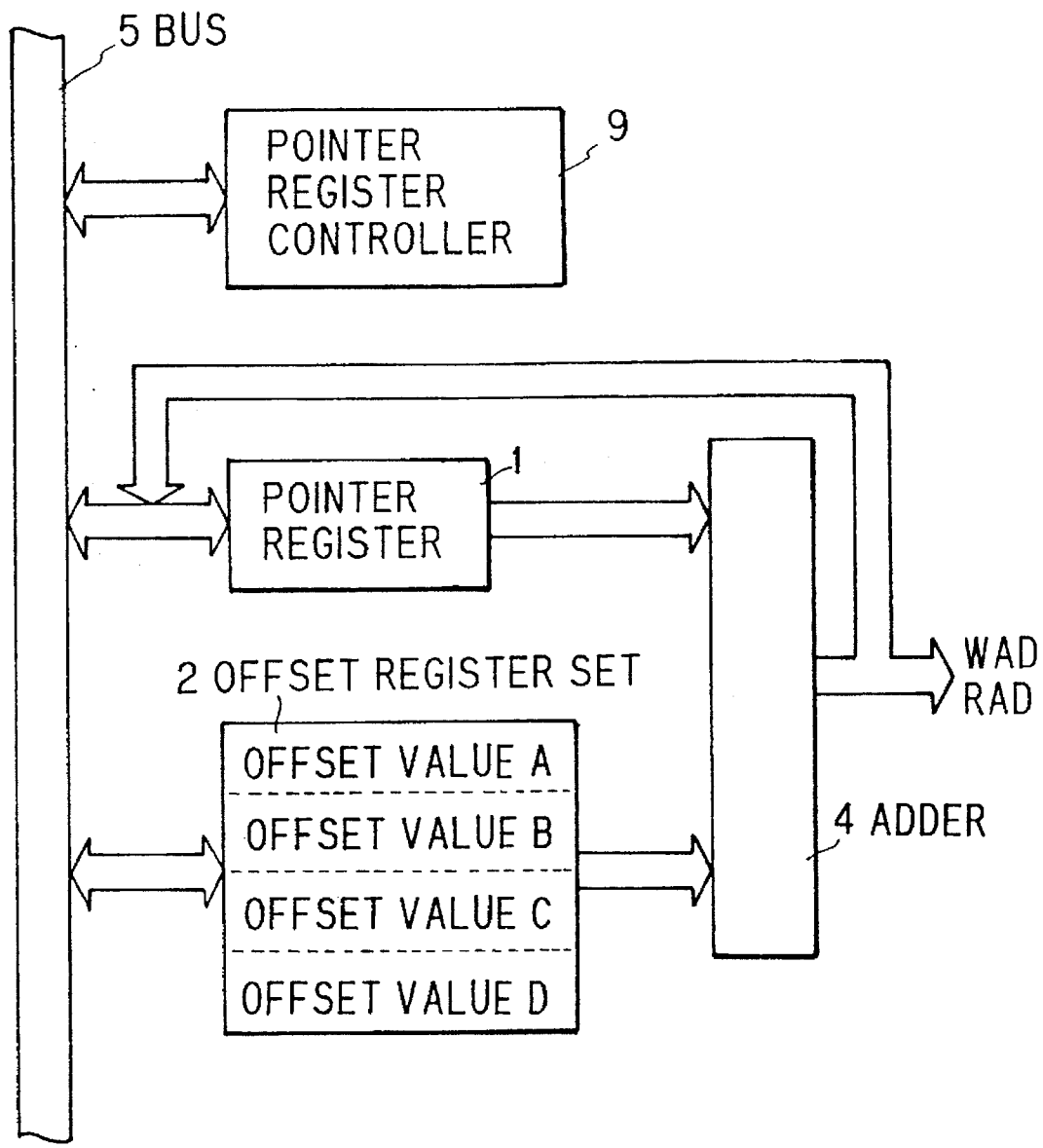
FIG. 4 is a block diagram showing another type of a conventional circuit for generating an address of a RAM.

The aforementioned second conventional address generation circuit comprises, as shown in FIG. 4, comprises a pointer register 1, an offset register set 2, an adder 4, a bus 5, and a pointer register controller 9. As mentioned before, the second conventional address generation circuit differs from the first conventional one as regards the offset register set 2 and the pointer register 9. That is, this address generation circuit combines the write and read offset register sets 7 and 8 shown in FIG. 2 into one common offset register set 2.

Because of this structure, the multiplexer 3 shown in FIG. 2 is omitted. Instead, the address generation circuit further comprises the pointer register controller 9. The pointer register controller 9 controls the pointer register 1 to provide a selected one from among the pointer values corresponding to write and read addresses. This address generation circuit can also form the address map shown in FIG. 3.

Figure 5:
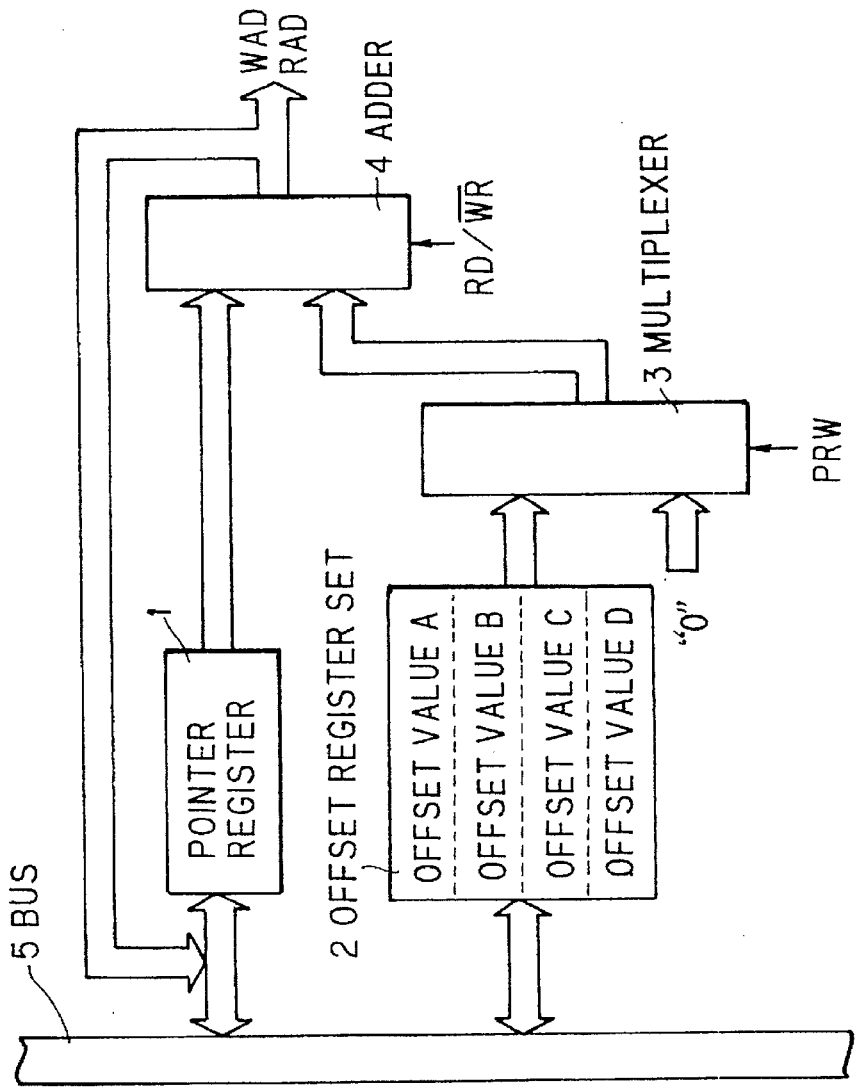
FIG. 5 is a block diagram showing a circuit for generating an address of a RAM in a first preferred embodiment according to the invention.
Figure 8:
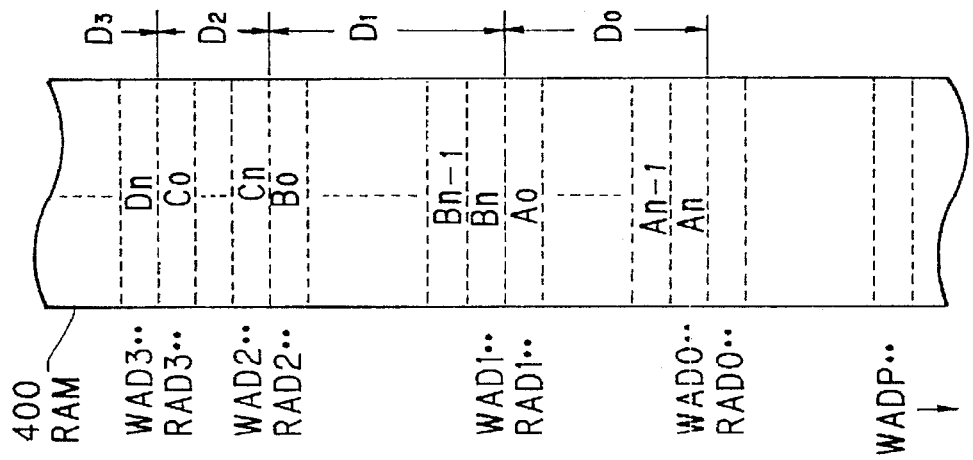
FIG. 8 is an explanatory diagram showing an address map of the RAM in FIG. 7.

Next, a description will be given of a circuit for generating an address of a RAM in the first preferred embodiment according to the present invention. This address generation circuit comprises, as shown in FIG. 5, a pointer register 1, an offset register set 2, a multiplexer 3, and an adder 4. The multiplexer 3 selects "0" supplied from a zero generator (not shown), when a pointer register write signal PRW of "1" is supplied thereto, so that a pointer value P is written into the pointer register 1. On the other hand, the multiplexer 3 selects one of the offset values A, B, C and D stored in the offset register set 2, when the signal PRW of "0" is supplied thereto. The adder 4 carries out the addition of the value P of the pointer register 1, an output of the multiplexer 3 and "1" when the write control signal $\overline{WR}$ is supplied thereto, and the addition of the value P of the pointer register 1 and the output of the multiplexer 3, when the read control signal RD is supplied thereto.

Figure 6:
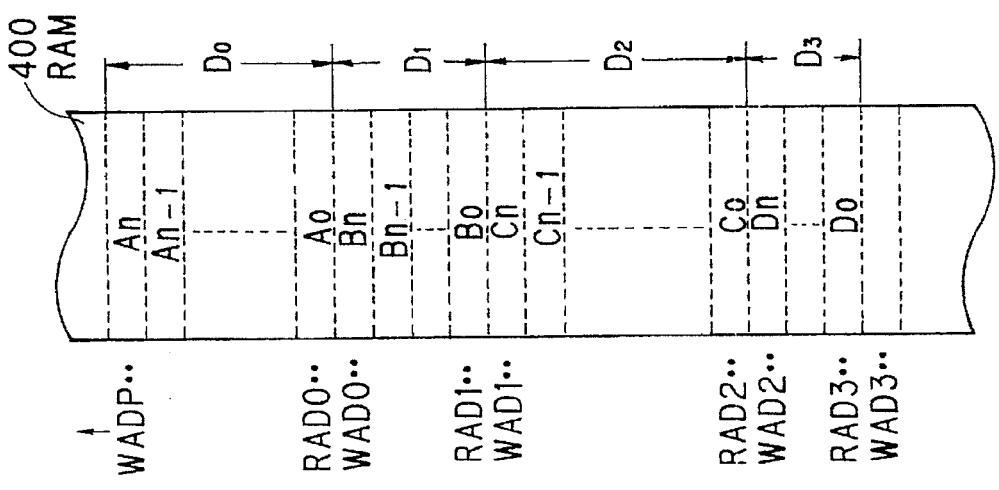
FIG. 6 is an explanatory diagram showing an address map of the RAM in FIG. 5.

In operation, the pointer value P is written into the pointer register 1, when the pointer register write signal PRW is "1", so that "0" is selected to be supplied to the adder 4 by the multiplexer 3. As a result, the addition of "P+1" is carried out in the adder 4, when the RD/$\overline{WR}$ signal is "0". Thus, the added value is supplied from the adder 4 as a write address WADP, at which time audio data An is written into the RAM 400 as shown in FIG. 6. Next, the offset value A is selected to be supplied to the adder 4 by the multiplexer 3, when the PRW signal becomes "0". As a result, the read address RAD0 of "P+A" is supplied from the adder 4 as shown in FIG. 6, when the RD/$\overline{WR}$ signal is "1". The audio data $A_0$ which was written at the read address RAD0 into the RAM 400, at a preceding time (n+1). Then, it is read therefrom at a delay time $D_0$ which is equal to an (n+1) write and read clock pulse duration corresponding to the difference between the addresses WADP and WAD0.

Next, the write address WAD0 of "P+A+1" is calculation in the adder 4, when the RD/$\overline{WR}$ signal becomes "0". Thus, write and read addresses are generated as follows.
(1) WRITE CYCLE (RD/$\overline{WR}$=0)
 (a) pointer write address WADP=P+1
 (b) 0th write address WAD0=P+A+1
 (c) 1st write address WAD1=P+B+1
 (d) 2nd write address WAD2=P+C+1
 (e) 3rd write address WAD3=P+D+1
(2) READ CYCLE (RD/WR=1)
 (a) 0th read address RAD0=P+A
 (b) 1st read address RAD1=P+B (c) 2nd read address RAD2=P+C (d) 3rd read address RAD3=P+D After one cycle of the write and read address generation, a pointer value of the pointer register 1 is decremented by one.

As apparent from the above, and from the illustration in FIG. 6, delay times $D_0$, $D_1$, $D_2$ and $D_4$ are obtained for audio data $A_0$, $B_0$, $C_0$ and $D_0$ which are read at the read addresses RAD0, RAD1, RAD2 and RAD3 from the RAM 400. In addition, each write address WADn (n=0,1,2, . . . ) is obtained in the addition of one to each preceding read address RADn (n=0,1,2, . . . ) by use of a single common offset register set 2. Consequently, the utilizing efficiency of the RAM 400 is much improved, and a software by which an address generation operation is controlled is simplified.

Figure 7:
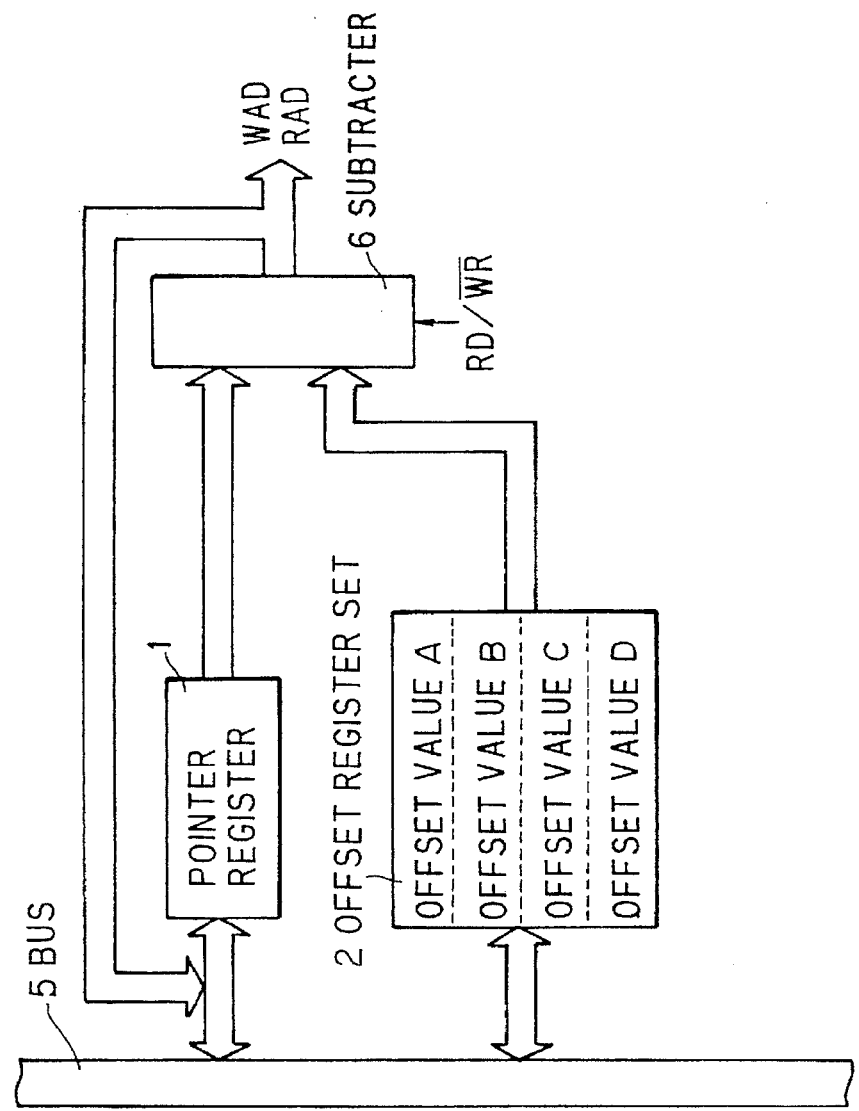
FIG. 7 is a block diagram showing a circuit for generating an address of a RAM in a second preferred embodiment according to the invention.

FIG. 7 shows a circuit for generating an address of a RAM in the second preferred embodiment according to the invention. This address generation circuit comprises a pointer register 1 for storing a pointer value, an offset register set 2 having a plurality of registers for storing offset values A, B, C and D, and a subtracter 6 for subtracting one of the offset values A, B, C and D from the pointer value to provide a read address RAD, and for subtracting one of the offset values A, B, C and D and "1" from the pointer value to provide a write address WAD. The pointer register 1 and the offset register set 2 are connected to a bus 5.

In operation, delay times $D_0$, $D_1$, $D_2$, . . . . are obtained, when audio data $A_0$, $B_0$, $C_0$, . . . . are read from the RAM 400 at addresses $RAD_1$, $RAD_2$, $RAD_3$ . . . . thereof.

In the first and second preferred embodiments, the offset register set 2 may be replaced by a RAM storing offset values.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A circuit for generating write and read addresses for a memory in order to write and read data into and from said memory, said circuit comprising:

a pointer register for temporarily storing a pointer value;

a plurality of offset registers for temporarily storing a plurality of offset values which are different from one another, respectively; and an address generator coupled to said pointer register and to said offset registers, said address generator generating a plurality of write addresses for said memory without changing said stored pointer value when in a data write mode and a plurality of read addresses for said memory when in a data read mode, said generation of said addresses being in response to said pointer value and said offset values, each of said write addresses being different from said pointer value by a sum of one and an associated one of said offset values, and each of said read addresses being different from said pointer value by an associated one of said offset values.

2. The circuit as claimed in claim 1, wherein said address generator generates each of said write addresses by adding one plus said pointer value and said associated one of said offset values, and generates each of said read addresses by adding said pointer value and said associated one of said offset values.

3. The circuit as claimed in claim 1, wherein said address generator generates each of said write addresses by subtracting said associated one of said offset values and one from said pointer value and generates each of said read addresses by subtracting said associated one of said offset values from said pointer value.

4. A circuit for generating write and read addresses for a memory in order to write and read data into and from said memory, said circuit comprising:

a pointer register for temporarily storing a pointer value;

a plurality of offset registers for temporarily storing a plurality of offset values which are, respectively, different from one another;

a multiplexer coupled to an output of said plurality of offset registers for selecting "0" in response to an active pointer register write signal for writing said pointer value into said pointer register, and for selecting one of said offset values in response to a non-active pointer register write for a selecting signal; and an adder for carrying out an addition of said pointer value, an output of said multiplexer and one in order to provide a write address without changing the stored pointer value, and an addition of said pointer value and said output of said multiplexer to provide a read address.

5. A circuit for generating write and read addresses for a memory to write and read data into and from said memory, said circuit comprising:

a pointer register for temporarily storing a pointer value;

a plurality of offset registers for temporarily storing a plurality of offset values which are different from one another; and a subtractor for subtracting one of said offset values from said pointer value in order to provide a read address, and a subtraction of one of said offset values and one from said pointer value to provide a write address without changing said stored pointer value.

* * * * *